(12) United States Patent
Kinpara et al.

(10) Patent No.: US 10,985,241 B2
(45) Date of Patent: Apr. 20, 2021

(54) SEMICONDUCTOR DEVICE AND PRODUCTION METHOD THEREOF

(71) Applicants: TOYOTA JIDOSHA KABUSHIKI KAISHA, Toyota (JP); DENSO CORPORATION, Kariya (JP)

(72) Inventors: Hiromichi Kinpara, Seto (JP); Yusuke Yamashita, Nagakute (JP); Yasushi Urakami, Kariya (JP)

(73) Assignees: TOYOTA JIDOSHA KABUSHIKI KAISHA, Toyota (JP); DENSO CORPORATION, Kariya (JP)

(*) Notice: Subject to any disclaimer, the term of this patent is extended or adjusted under 35 U.S.C. 154(b) by 0 days.

(21) Appl. No.: 16/339,223

(22) PCT Filed: Sep. 26, 2017

(86) PCT No.: PCT/IB2017/001168
§ 371 (c)(1),
(2) Date: Apr. 3, 2019

(87) PCT Pub. No.: WO2018/073638
PCT Pub. Date: Apr. 26, 2018

(65) Prior Publication Data
US 2020/0044018 A1    Feb. 6, 2020

(30) Foreign Application Priority Data

Oct. 21, 2016    (JP) .............................. JP2016-207266

(51) Int. Cl.
*H01L 29/06*    (2006.01)
*H01L 21/04*    (2006.01)
(Continued)

(52) U.S. Cl.
CPC ...... *H01L 29/0623* (2013.01); *H01L 21/0465* (2013.01); *H01L 21/761* (2013.01);
(Continued)

(58) Field of Classification Search
CPC . H01L 29/0619; H01L 29/872; H01L 29/7811
See application file for complete search history.

(56) References Cited

U.S. PATENT DOCUMENTS

2012/0205770 A1* 8/2012 Tung ................... H01L 29/8611
257/471
2012/0228636 A1* 9/2012 Maeyama ............. H01L 29/872
257/77

(Continued)

FOREIGN PATENT DOCUMENTS

DE    102016105041 A1    10/2016
EP         2498292 A2      9/2012
(Continued)

OTHER PUBLICATIONS

Partial Translation of Jan. 21, 2020 Office Action issued in Japanese Patent Application No. 2016-207266.

*Primary Examiner* — Changhyun Yi
(74) *Attorney, Agent, or Firm* — Oliff PLC (57) ABSTRACT

A semiconductor device includes a semiconductor substrate, which includes an element region and an outer-periphery voltage withstanding region. The outer-periphery voltage withstanding region includes a plurality of p-type guard rings surrounding the element region in a multiple manner. Each of the guard rings includes a high concentration region and a low concentration region. A low concentration region of an outermost guard ring includes a first part positioned on an outer peripheral side of its high concentration region. Respective low concentration regions of the guard rings include respective second parts, each positioned in a range sandwiched between corresponding two adjacent high concentration regions among a plurality of concentration regions. A width of the first part on a front surface is wider than widths of the second parts on the front surface.

4 Claims, 9 Drawing Sheets

(51) Int. Cl.
    *H01L 21/761*     (2006.01)
    *H01L 29/16*     (2006.01)
    *H01L 29/739*     (2006.01)
    *H01L 29/78*     (2006.01)
    *H01L 29/872*     (2006.01)

(52) U.S. Cl.
    CPC ...... *H01L 29/1608* (2013.01); *H01L 29/7397* (2013.01); *H01L 29/7811* (2013.01); *H01L 29/7813* (2013.01); *H01L 29/8725* (2013.01)

(56) References Cited

U.S. PATENT DOCUMENTS

| | | | |
|---|---|---|---|
| 2015/0115286 A1* | 4/2015 | Takeuchi | H01L 21/8213 257/77 |
| 2015/0255535 A1 | 9/2015 | Taguchi et al. | |
| 2015/0364541 A1 | 12/2015 | Senoo | |
| 2016/0300960 A1 | 10/2016 | Miyake et al. | |

FOREIGN PATENT DOCUMENTS

| | | | |
|---|---|---|---|
| JP | 2000-114549 A | 4/2000 | |
| JP | 2001-094095 A | 4/2001 | |
| JP | 2005-135972 A | 5/2005 | |
| WO | 2011/141981 A1 | 11/2011 | |
| WO | 2014/054319 A1 | 4/2014 | |
| WO | 2014/125626 A1 | 8/2014 | |

* cited by examiner

SEMICONDUCTOR DEVICE AND PRODUCTION METHOD THEREOF

BACKGROUND OF THE INVENTION

1. Field of the Invention

The technique disclosed herein relates to a semiconductor device and a production method thereof.

2. Description of Related Art

Japanese Patent Application Publication No. 2000-114549 (JP 2000-114549 A) discloses a semiconductor device including an element region and an outer-periphery voltage withstanding region around the element region. The element region is provided with a vertical semiconductor element. The outer-periphery voltage withstanding region is provided with a plurality of p-type guard rings and an n-type outer-periphery drift region. The guard rings surround the element region in a multiple manner and are placed in a range facing a front surface of a semiconductor substrate. The outer-periphery drift region separates the guard rings from each other. When the semiconductor element provided in the element region is turned off, a depletion layer extends from the element region to the outer-periphery voltage withstanding region. The depletion layer extends toward an outer peripheral side inside the outer-periphery drift region through the plurality of guard rings. The extension of the depletion layer toward the outer peripheral side is promoted by the plurality of guard rings. By providing the plurality of guard rings, it is possible to extend the depletion layer in a wide range of the outer-periphery drift region, thereby making it possible to improve a withstand voltage of the semiconductor device.

SUMMARY OF THE INVENTION

Figure 14:
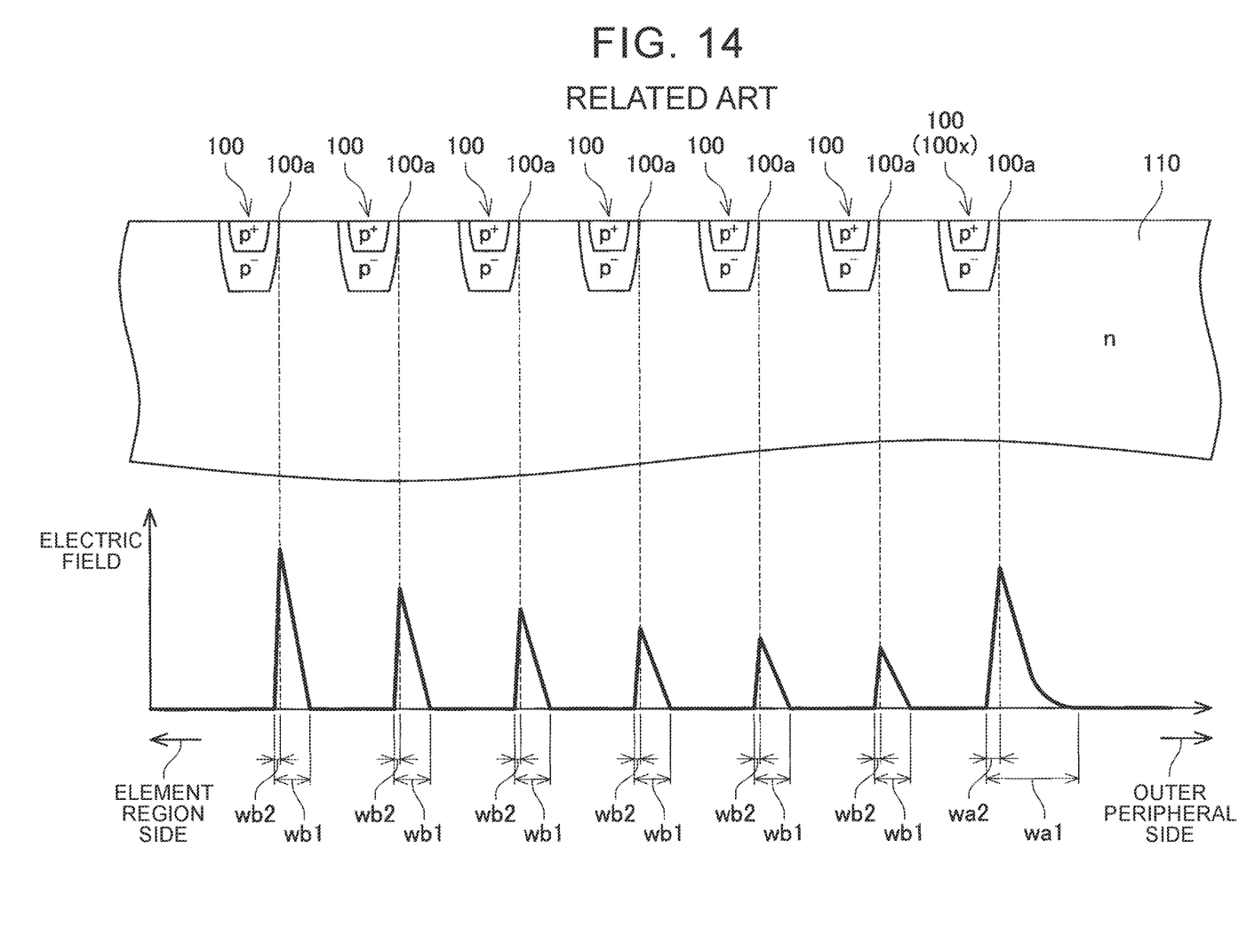
FIG. 14 is a sectional view and an electric field distribution map of a semiconductor device in a related art.

An upper diagram of FIG. 14 is a sectional view of an outer-periphery voltage withstanding region of a semiconductor device in a related art, and a lower diagram of FIG. 14 illustrates an electric field distribution in the outer-periphery voltage withstanding region. The lower diagram of FIG. 14 illustrates an electric field in the vicinity of a front surface of a semiconductor substrate. In each guard ring 100, a p-type impurity concentration is distributed such that the p-type impurity concentration is high at a central part and decreases toward a peripheral part (a part near an outer-periphery drift region 110). In FIG. 14, a high concentration region in which the p-type impurity concentration is high is indicated as a $p^+$ region, and a low concentration region in which the p-type impurity concentration is low is indicated as a $p^-$ region. When a depletion layer expands in the outer-periphery voltage withstanding region, an electric field is generated in a pn junction 100a (a boundary surface between the guard ring 100 and the outer-periphery drift region 110) positioned at an outer peripheral end of the guard ring 100. A width Wa1 of a distribution range of the electric field in an outermost guard ring 100x, which is a guard ring placed on an outermost peripheral side, is wider than widths Wb1 of respective distribution ranges of the electric field in the other guard rings 100. The reason why the width Wa1 becomes wider than the widths Wb1 as such is as follows. That is, the outermost guard ring 100x does not have a guard ring 100 on its outer peripheral side, whereas the other guard rings 100 each have an adjacent guard ring 100 on their outer peripheral sides. Since the width Wa1 is wider than the widths Wb1, a width Wa2 of a part where an electric field is generated inside the outermost guard ring 100x is-wider than widths Wb2 of respective parts where an electric field is generated inside the other guard rings 100. On this account, in the outermost guard ring 100x, the electric field is applied to the high concentration region (the $p^+$ region). Crystal defects exist at a high density in the high concentration region, and therefore, when the electric field is applied to the high concentration region, a leak current occurs. As such, the semiconductor device of the related art has a possibility that a leak current easily occurs in the outermost guard ring.

A semiconductor device in this disclosure includes: a semiconductor substrate; a front-surface electrode making contact with a front surface of the semiconductor substrate; and a back-surface electrode making contact with a back surface of the semiconductor substrate, wherein: the semiconductor substrate includes an element region overlapping with a contact face between the front-surface electrode and the semiconductor substrate in a plan view of the semiconductor substrate along a thickness direction of the semiconductor substrate, and an outer-periphery voltage withstanding region provided around the element region; the element region includes a semiconductor element capable of applying an electric current between the front-surface electrode and the back-surface electrode; the outer-periphery voltage withstanding region includes a plurality of p-type guard rings facing the front surface and surrounding the element region in a multiple manner, and an n-type outer-periphery drift region separating the guard rings from each other; each of the guard rings includes a high concentration region having a p-type impurity concentration higher than 10% of a peak value of a p-type impurity concentration of the each of the guard rings, and a low concentration region having a p-type impurity concentration equal to or lower than 10% of the peak value and placed between the high concentration region and the outer-periphery drift region; the low concentration region of an outermost guard ring positioned on an outermost peripheral side, among the plurality of guard rings, includes a first part positioned on an outer peripheral side of the high concentration region of the outermost guard ring; respective low concentration regions of the guard rings include respective second parts each positioned in a range sandwiched between corresponding two adjacent high concentration regions among the plurality of high concentration regions; and a width of the first part on the front surface is wider than widths of the second parts on the front surface.

Note that, in the present specification, the widths of the first part and the second parts indicate dimensions in a direction from an inner peripheral side (an element region side) toward an outer peripheral side (an outer peripheral end surface side of the semiconductor substrate).

Figure 15:
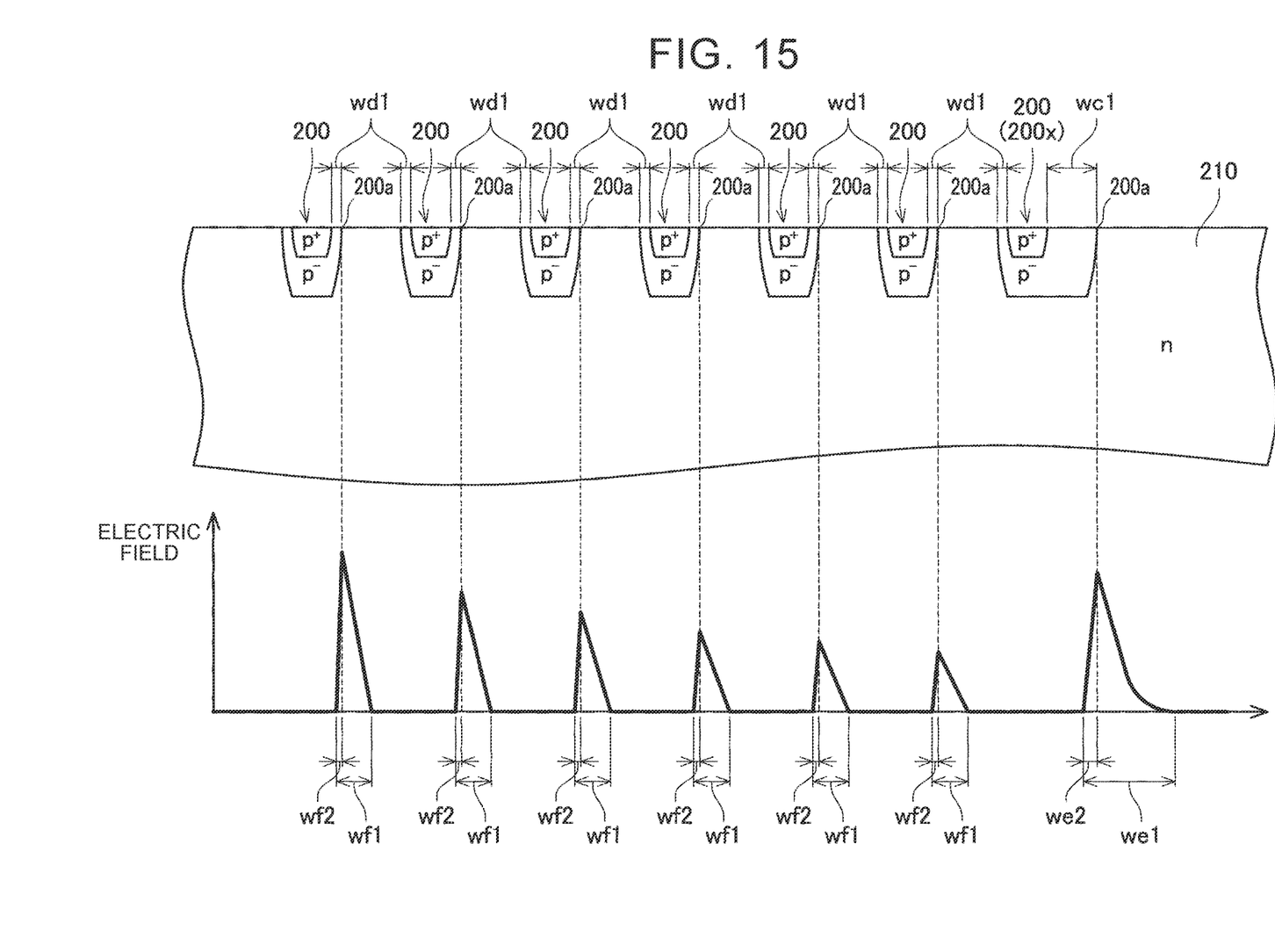
FIG. 15 is a sectional view and an electric field distribution map of an exemplary semiconductor device disclosed in the present specification.

FIG. 15 illustrates one exemplary semiconductor device disclosed in the present specification. An upper diagram of FIG. 15 is a sectional view of an outer-periphery voltage withstanding region and a lower diagram of FIG. 15 illustrates an electric field distribution in the outer-periphery voltage withstanding region. In FIG. 15, a plurality of guard rings 200 and an outer-periphery drift region 210 are illustrated. Each of the guard rings 200 includes a high concentration region (a $p^+$-region) in which a p-type impurity concentration is high, and a low concentration region (a $p^-$-region) in which the p-type impurity concentration is low. Note that a crystal defect density in the high concentration region is higher than a crystal defect density in the low concentration region. In the guard ring 200, the low concentration region is placed between the high concentration region and the outer-periphery drift region 210. A low concentration region of an outermost guard ring 200x includes a first part 201 positioned on an outer peripheral side of a high concentration region of the outermost guard ring 200x. Further, the low concentration regions include respective second parts 202 each placed within a range sandwiched between a corresponding pair of high concentration regions adjacent to each other. A width Wc1 of the first part 201 on a front surface is wider than widths Wd1 of the second parts 202 on the front surface. When a depletion layer expands in the outer-periphery voltage withstanding region, an electric field is generated in a pn junction 200a positioned at an outer peripheral end of each of the guard rings 200. A width We1 of a distribution range of the electric field is wide in the pn junction 200a of the outermost guard ring 200x. Because of this, a width We2 of a distribution range of the electric field in the first part 201 is also wide. However, since the width Wc1 of the first part 201, which is a low concentration region, is wide, the electric field is hardly applied to the high concentration region of the outermost-guard ring 200x. Since the electric field can be hardly applied to the high concentration region where a crystal defect density is high, a leak current is restrained. Further, a width Wf1 of a distribution range of the electric field is narrow in the pn junction 200a of each of the other guard rings 200. Because of this, a width Wf2 of a distribution range of the electric field in the second part 202 adjacent to the pn junction 200a is also narrow. Because of this, in each of the other guard rings 200, even if the width Wd1 of the second part 202 adjacent to the pn junction 200a is narrow, the electric field can be hardly applied to the high concentration region. Further, when a distance between the high concentration regions becomes wider, the electric field to be applied to the pn junction 200a increases, so that a withstand voltage of the semiconductor device decreases. By narrowing the widths Wd1 of the second parts 202, it is possible to reduce a distance between the high concentration regions, thereby making it possible to improve the withstand voltage of the semiconductor device. As described above, with the semiconductor device, it is possible to restrain a leak current in the guard ring 200 and to achieve a high withstand voltage of the semiconductor device. Note that FIG. 15 is used in the above description, but the semiconductor device proposed in the present specification is not limited to the configuration of FIG. 15. A position and a shape of each of the semiconductor regions, the number of semiconductor regions, and the like can be modified appropriately. Even in a case where the position and the shape of each of the semiconductor regions, the number of semiconductor regions, and the like are modified, if the structure proposed by the present specification is provided, it is possible to restrain a leak current in a guard ring and to achieve a high withstand voltage of the semiconductor device.

The semiconductor substrate may be an SiC substrate.

A production method of a semiconductor device, according to the disclosure, includes: forming a plurality of p-type guard rings facing a front surface of a semiconductor substrate and surrounding a specific region in a multiple manner by injecting p-type impurities into the semiconductor substrate; and completing the semiconductor device by use of the semiconductor substrate, wherein: the semiconductor device includes a front-surface electrode making contact with the front surface of the semiconductor substrate, a back-surface electrode making contact with a back surface of the semiconductor substrate, a semiconductor element provided within the specific region and capable of applying an electric current between the front-surface electrode and the back-surface electrode, and an n-type outer-periphery drift region separating the plurality of guard rings from each other; each of the guard rings includes a high concentration region having a p-type impurity concentration higher than 10% of a peak value of a p-type impurity concentration of the each of the guard rings, and a low concentration region having a p-type impurity concentration equal to or lower than 10% of the peak value and placed between the high concentration region and the outer-periphery drift region; the low concentration region of an outermost guard ring positioned on an outermost peripheral side, among the plurality of guard rings, includes a first part positioned on an outer peripheral side of the high concentration region of the outermost guard ring; respective low concentration regions of the guard rings include respective second parts each positioned in a range sandwiched between corresponding two adjacent high concentration regions among the plurality of high concentration regions; and a width of the first part on the front surface is wider than widths of the second parts on the front surface.

Note that a part of the step of completing the semiconductor device by use of the semiconductor substrate may be performed before the step of forming the guard rings.

In the production method of the semiconductor device, according to the disclosure, in the forming of the guard rings, a mask having openings, a blocking portion, and a low permeability portion is formed on the front surface of the semiconductor substrate, and the p-type impurities are injected into the semiconductor substrate through the mask; in the injecting of the p-type impurities, a permeability of the p-type impurities in the low permeability portion is lower than a permeability of the p-type impurities in the openings, but is higher than a permeability of the p-type impurities in the blocking portion; the high concentration regions are formed in respective regions within the semiconductor substrate, the respective regions being placed below respective openings; and the first part is formed in a region within the semiconductor substrate, the region being placed below the low permeability portion.

With the production method, it is possible to form the first portion in the low concentration region of the outermost guard ring appropriately.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
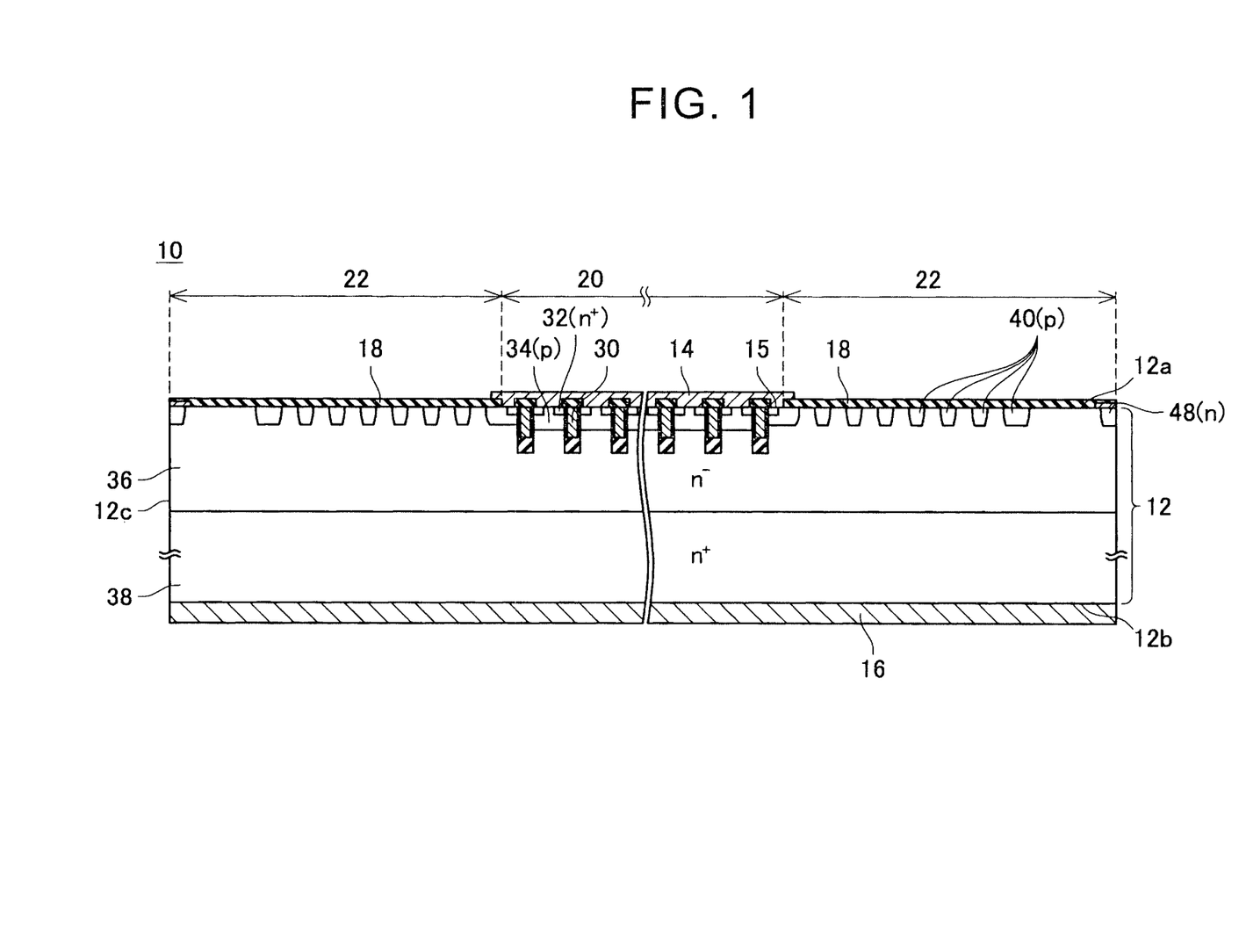
FIG. 1 is a sectional view of a semiconductor device of an embodiment (a sectional view along a line I-I in FIG. 2)
Figure 2:
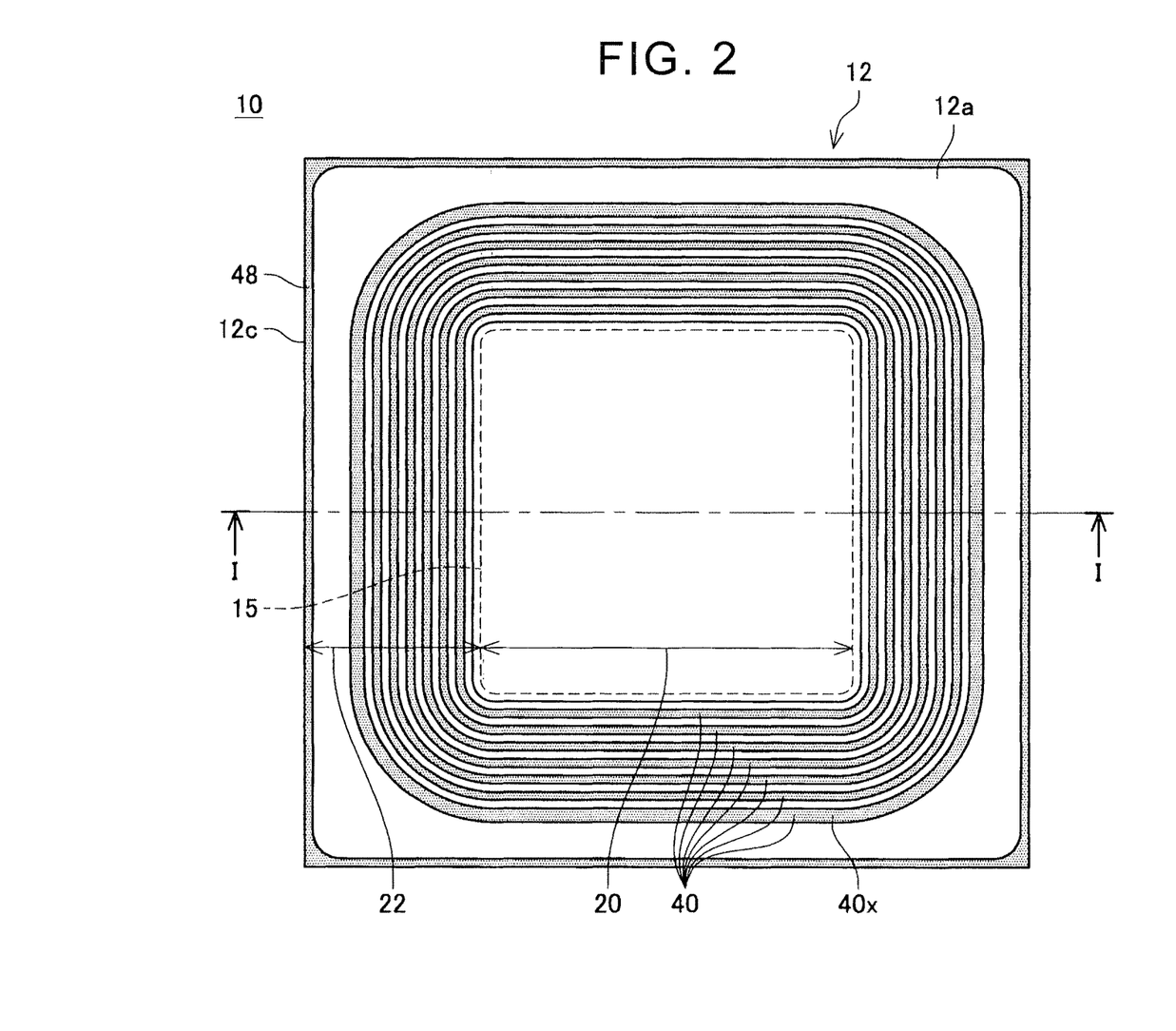
FIG. 2 is a plan view of the semiconductor device of the embodiment (a view illustrating an arrangement of guard rings and an end n-type region by dot hatching)

A semiconductor device 10 of an embodiment illustrated in FIGS. 1 and 2 includes a semiconductor substrate 12. The semiconductor substrate 12 is an SiC substrate. As illustrated in FIG. 1, a front-surface electrode 14 and an insulating film 18 are provided on a front surface 12*a* of the semiconductor substrate 12. Note that, in FIG. 2, an electrode and an insulating film (including the front-surface electrode 14 and the insulating film 18) on the front surface 12*a* are not illustrated. A dotted line in FIG. 2 indicates a contour of a contact face 15 where the front-surface electrode 14 makes contact with the semiconductor substrate 12. The front-surface electrode 14 makes contact with the semiconductor substrate 12 in a central part of the front surface 12*a* of the semiconductor substrate 12. The insulating film 18 covers a region of the front surface 12*a*, the region being not covered with the front-surface electrode 14. That is, the insulating film 18 covers an outer periphery of the front surface 12*a* of the semiconductor substrate 12. As illustrated in FIG. 1, a back-surface electrode 16 is formed on a back surface 12*b* of the semiconductor substrate 12. The back-surface electrode 16 covers a whole area of the back surface 12*b* of the semiconductor substrate 12. In the following description, a region overlapping with the contact face 15 when viewed along a thickness direction of the semiconductor substrate 12 is referred to as an element region 20. Further, a region outside the element region 20 (a region between the element region 20 and an outer peripheral end surface 12*c* of the semiconductor substrate 12) is referred to as an outer-periphery voltage withstanding region 22. The outer-periphery voltage withstanding region 22 surrounds the element region 20. Further, in the following description, in the outer-periphery voltage withstanding region 22, a side closer to the element region 20 is referred to as an inner peripheral side, and a side closer to the outer peripheral end surface 12*c* is referred to as an outer peripheral side.

As illustrated in FIG. 1, the semiconductor substrate 12 includes a drain region 38 and a drift region 36. The drain region 38 is an n-type region having a high n-type impurity concentration. The drain region 38 is distributed throughout the semiconductor substrate 12 in its lateral direction from the element region 20 to the outer-periphery voltage withstanding region 22. The drain region 38 is placed in a range facing the back surface 12*b* of the semiconductor substrate 12. The drain region 38 makes ohmic contact with the back-surface electrode 16 in the whole back surface 12*b*. The drift region 36 is an n-type region having a lower n-type impurity concentration than the drain region 38. The drift region 36 is distributed throughout the semiconductor substrate 12 in the lateral direction from the element region 20 to the outer-periphery voltage withstanding region 22. The drift region 36 is placed on the drain region 38 and makes contact with the drain region 38.

A plurality of gate electrodes 30, a plurality of source regions 32, and a body region 34 are provided in the element region 20. A plurality of trenches is provided on the front surface 12*a* of the semiconductor substrate 12 within the element region 20. The gate electrodes 30 are provided in respective trenches. The gate electrode 30 is insulated from the semiconductor substrate 12 by a gate insulating film covering an inner surface of a corresponding trench. A top surface of the gate electrode 30 is covered with an interlayer insulator, and a top surface of the interlayer insulator is covered with the front-surface electrode 14. The gate electrode 30 is insulated from the front-surface electrode 14 by the interlayer insulator.

The source region 32 is an n-type region having a high n-type impurity concentration. The source region 32 is placed in a range facing the front surface 12*a* of the semiconductor substrate 12. The source region 32 makes ohmic contact with the front-surface electrode 14. The source region 32 makes contact with the gate insulating film in an upper end of a corresponding trench.

The body region 34 is a p-type region. The body region 34 extends from a position (a position facing the front surface 12*a*) adjacent to the source regions 32 to a position below the source regions 32. A p-type impurity concentration in the body region 34 is high at the position facing the front surface 12*a*, but is low at the position below the source regions 32. The body region 34 makes ohmic contact with the front-surface electrode 14 at the position facing the front surface 12*a*. The body region 34 makes contact with the gate insulating film at the position below the source regions 32. The drift region 36 is placed below the body region 34. The body region 34 makes contact with the drift region 36. The drift region 36 makes contact with the gate insulating film below the body region 34.

A MOSFET is formed by the gate electrodes 30, the source regions 32, the body region 34, the drift region 36, and the drain region 38 within the element region 20. When the MOSFET is turned on, a current flows from the back-surface electrode 16 to the front-surface electrode 14.

Figure 3:
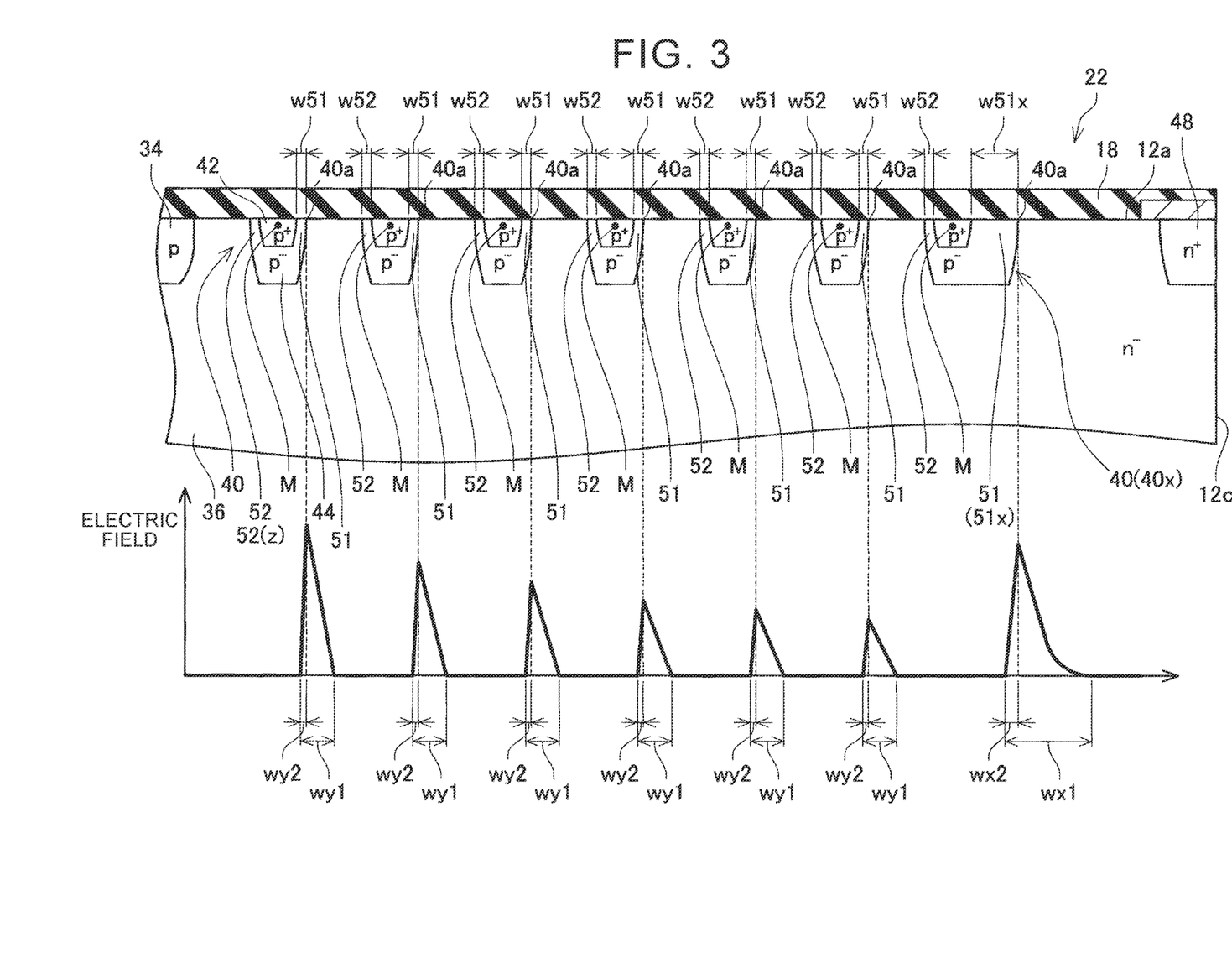
FIG. 3 is an enlarged sectional view and an electric field distribution map of an outer-periphery voltage withstanding region.

A plurality of guard rings 40 is provided in the outer-periphery voltage withstanding region 22. The guard rings 40 are p-type regions. As illustrated in FIGS. 1 to 3, the guard rings 40 face the front surface 12*a* of the semiconductor substrate 12 within the outer-periphery voltage withstanding region 22 (that is, the guard rings 40 are exposed to the front surface 12*a*). As illustrated in FIG. 2, the guard rings 40 extend in an annular shape in a plan view of the semiconductor substrate 12 in a thickness direction. The plurality of guard rings 40 surround the element region 20 in a multiple manner. As illustrated in FIG. 3, a part of the drift region 36 is placed at a position between the guard rings 40. The guard rings 40 are separated from each other by the drift region 36. Further, the guard ring 40 on an innermost peripheral side is separated from the body region 34 by the drift region 36. Top surfaces of the guard rings 40 are covered with the insulating film 18.

A p-type impurity concentration changes depending on a position inside the guard ring 40. As illustrated in FIG. 3, the guard ring 40 has a peak point M where the p-type impurity concentration is highest in itself, at a position near the front surface 12a of the semiconductor substrate 12. Inside the guard ring 40, the p-type impurity concentration decreases from the peak point M toward the drift region 36. In the present specification, in the guard ring 40, a region having a p-type impurity concentration higher than 10% of the p-type impurity concentration at the peak point M is referred to as a high concentration region 42, and a region having a p-type impurity concentration equal to or lower than 10% of the p-type impurity concentration at the peak point M is referred to as a low concentration region 44. In FIG. 3, the high concentration region 42 is illustrated as a $p^+$-type region, and the low concentration region 44 is illustrated as a $p^-$-type region. In the guard ring 40, the high concentration region 42 is distributed around the peak point M, and faces the front surface 12a of the semiconductor substrate 12. In the guard ring 40, the low concentration region 44 is distributed between the high concentration region 42 and the drift region 36. That is, in the guard ring 40, the low concentration region 44 is placed on a lateral side of the high concentration region 42 and on the lower side of the high concentration region 42. Since the high concentration region 42 is formed by injecting p-type impurities into the semiconductor substrate 12 at a high concentration, crystal defects exist at a high density in the high concentration region 42. The low concentration region 44 is formed by p-type impurities diffused from the high concentration region 42 or by p-type impurities injected into the semiconductor substrate 12 at a low concentration, and therefore, a density of crystal defects is low in the low concentration region 44.

In the guard ring 40, the low concentration region 44 faces the front surface 12a on both the inner peripheral side and the outer peripheral side of the high concentration region 42. In the following description, in the guard ring 40, a part of the low concentration region 44, the part being adjacent to the high concentration region 42 on the outer peripheral side is referred to as an outer peripheral part 51, and a part of the low concentration region 44, the part being adjacent to the high concentration region 42 on the inner peripheral side is referred to as an inner peripheral part 52. As is apparent from FIG. 3, except for an outer peripheral part 51x of a guard ring 40x placed on an outermost peripheral side and an inner peripheral part 52z of a guard ring 40 placed on an innermost peripheral side, the outer peripheral parts 51 and the inner peripheral parts 52 are each placed in a range sandwiched between corresponding two of the high concentration regions 42 (a pair of high concentration regions 42 adjacent to each other).

A low concentration region 44 of the outermost guard ring 40x placed on the outermost peripheral side among the plurality of guard rings 40 has the outer peripheral part 51x with a wide width. On the front surface 12a, a width W51x of the outer peripheral part 51x of the outermost guard ring 40x is wider than widths W51 of the other outer peripheral parts 51 and widths W52 of the inner peripheral parts 52. Note that the widths W51x, W51, and W52 are dimensions in a direction from the inner peripheral side toward the outer peripheral side. The widths W51 and the widths W52 are generally equal to each other. The high concentration regions 42 have generally the same widths. On this account, a width of the outermost guard ring 40x is wider than widths of the other guard rings 40.

As illustrated in FIGS. 1 to 3, an end n-type region 48 is provided in the outer-periphery voltage withstanding region 22. The end n-type region 48 is an n-type region having a higher n-type impurity concentration than the drift region 36. The end n-type region 48 is placed in a range facing the front surface 12a and the outer peripheral end surface 12c. The end n-type region 48 extends in an annular manner along the outer peripheral end surface 12c. The end n-type region 48 is separated from the outermost guard ring 40x by the drift region 36. A distance between the end n-type region 48 and the outermost guard ring 40x is wider than a distance between the guard rings 40.

Next will be described an operation of the semiconductor device 10. At the time of an operation of the semiconductor device 10, a potential higher than the front-surface electrode 14 is applied to the back-surface electrode 16. When a potential higher than a threshold is applied to the gate electrodes 30, a channel is formed in the body region 34 within a range where the body region 34 makes contact with the gate insulating film. As a result, electrons flow from the front-surface electrode 14 to the back-surface electrode 16 through the source regions 32, the channel, the drift region 36, and the drain region 38. That is, the MOSFET is turned on. When the potential of the gate electrodes 30 is decreased to the threshold or less, the channel disappears and the flow of electrons stops. That is, the MOSFET is turned off. When the MOSFET is turned off, a depletion layer expands from the body region 34 into the drift region 36. In the drift region 36 in the element region 20, the depletion layer expands from a front side to a back side. In the drift region 36 in the outer-periphery voltage withstanding region 22, a depletion layer expands from the inner peripheral side toward the outer peripheral side. When the depletion layer extending from the body region 34 reaches the guard ring 40 on the innermost peripheral side, the depletion layer further extends toward the outer peripheral side from the guard ring 40. When the depletion layer extending from the guard ring 40 on the innermost peripheral side reaches a second innermost guard ring 40, the depletion layer further extends toward the outer peripheral side from the guard ring 40. Thus, in the outer-periphery voltage withstanding region 22, the depletion layer extends toward the outer peripheral side through the plurality of guard rings 40. That is, each of the guard rings 40 promotes the depletion layer to extend toward the outer peripheral side. The depletion layer extends to the vicinity of the end n-type region 48.

When the depletion layer extends to the drift region 36 in the outer-periphery voltage withstanding region 22, a voltage is applied to a pn junction 40a positioned at an outer peripheral end of each of the guard rings 40. Because of this, the low concentration regions 44 are depleted near respective pn junctions 40a. That is, the depletion layer expands into the outer peripheral part 51 from the pn junction 40a. An electric field is generated inside depletion layers on both sides of the pn junction 40a (that is, a depletion layer formed by depletion of the n-type drift region 36 and a depletion layer formed by depletion of the outer peripheral part 51 of the p-type low concentration region 44. Here, a width Wx1 of a part where an electric field is generated in the pn junction 40a of the outermost guard ring 40x is wider than a width Wy1 of a part where an electric field is generated in the pn junction 40a of each of the other guard rings 40. On this account, a width Wx2 of a part (a part to be depleted) where an electric field is generated within the outer peripheral part 51x of the outermost guard ring 40x is wider than a width Wy2 of a part where an electric field is generated within the outer peripheral part 51 of each of the other guard rings 40. In the meantime, as described above, the width W51x of the outer peripheral part 51x of the outermost guard ring 40x is wider than the widths W51 of the other outer peripheral parts 51 of the other guard rings 40. On this account, even if the width Wx2 of the part where the electric field is generated is large in the outermost guard ring 40x, the part where the electric field is generated does not reach the high concentration region 42 (that is, a relationship of W51x>Wx2 is established). As such, since the outermost guard ring 40x is provided with the outer peripheral part 51x having a wide width on the outer peripheral side of the high concentration region 42, it is possible to restrain the electric field from being applied to the high concentration region 42. That is, by depleting the outer peripheral part 51x having the wide width W51x, it is possible to restrain the depletion layer from reaching the high concentration region 42. Since the electric field can be hardly applied to the high concentration region 42 where a crystal defect density is high, a leak current hardly occurs in the high concentration region 42. Further, even if the electric field is applied to the outer peripheral part 51x having a low crystal defect density (that is, the low concentration region 44), a leak current hardly occurs. This accordingly makes it possible to restrain a leak current in the outermost guard ring 40x.

Further, in the guard rings 40 other than the outermost guard ring 40x, the width W51 of the outer peripheral part 51 is narrow. However, in those guard rings, the width Wy2 of the part where the electric field is generated is narrow. Accordingly, even if the width W51 of the outer peripheral part 51 is narrow, the electric field can be hardly applied to the high concentration region 42. Accordingly, a leak current is restrained also in the guard rings 40 other than the outermost guard ring 40x.

Further, if the distance between the high concentration regions 42 becomes wide, the electric field is easily concentrated on the pn junctions 40a, which decreases a withstand voltage of the semiconductor device 10. In this regard, in the present embodiment, the width W51x of the outer peripheral part 51x of the outermost guard ring 40x is wide, whereas the widths W51 of the other outer peripheral parts 51 and the widths W52 of the inner peripheral parts 52 are narrow. Because of this, the distance between the high concentration regions 42 is narrow. This accordingly secures a withstand voltage of the semiconductor device 10. Further, by narrowing the distance between the high concentration regions 42, the semiconductor device 10 is downsized.

Next will be described a production method of the semiconductor device 10. Note that the production method has a feature in a forming step of the guard rings 40, and therefore, the following describes the forming step of the guard rings 40 and descriptions about the other steps are omitted. Further, FIGS. 4 to 13 used in the following description illustrate a range where the outermost guard ring 40x and its adjacent guard ring 40 are to be formed.

Figure 4:
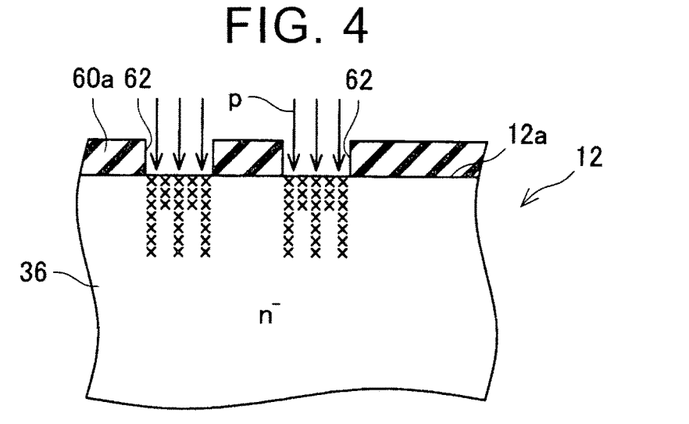
FIG. 4 is an explanatory view of a production method of a semiconductor device (a sectional view of a guard-ring formation part)
Figure 5:
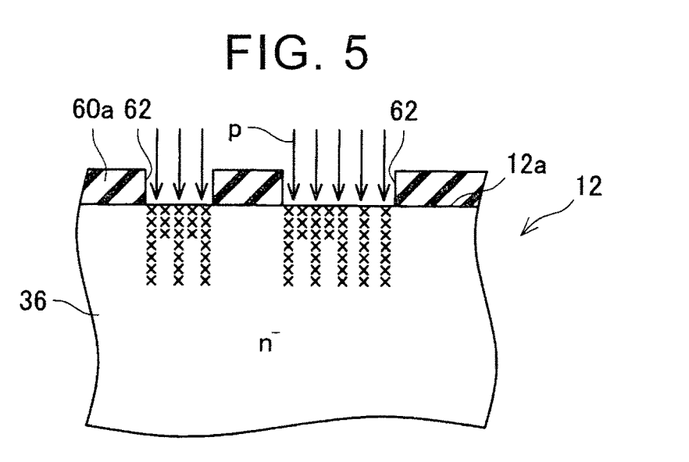
FIG. 5 is an explanatory view of the production method of the semiconductor device (a sectional view of the guard-ring formation part)
Figure 6:
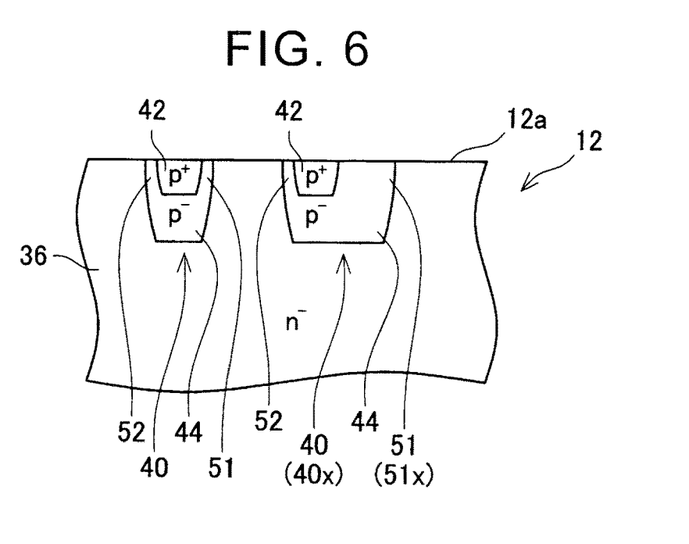
FIG. 6 is an explanatory view of the production method of the semiconductor device (a sectional view of the guard-ring formation part)

FIGS. 4 to 6 illustrate a first production method. First, a semiconductor substrate 12 (a semiconductor substrate before machining) in which an n-type drift region 36 is exposed to a front surface 12a is prepared. Subsequently, as illustrated in FIG. 4, a mask 60a (an oxide film, a resist, and the like) for ion implantation is formed on the front surface 12a of the semiconductor substrate 12. The mask 60a is patterned so that openings 62 are formed at positions corresponding to respective guard rings 40. Subsequently, p-type impurities are injected into the semiconductor substrate 12 several times through the mask 60a while an impurity implantation energy (that is, an impurity injection depth) is changed. Hereby, the p-type impurities are injected into lower semiconductor layers of the openings 62. Herein, the p-type impurities are injected at a high concentration in a shallow range, and the p-type impurities are injected at a low concentration in a deep range. In a range (the shallow range) where the p-type impurities are injected at a high concentration, crystal defects are generated at a high density. Then, as illustrated in FIG. 5, a width of the opening 62 on the outermost peripheral side (that is, the opening 62 corresponding to an outermost guard ring 40x) is enlarged. More specifically, an outer peripheral wall surface of the opening 62 on the outermost peripheral side is shifted further to the outer peripheral side, so as to enlarge a width of this opening 62. In a case where the mask 60a is an oxide film, additional etching is performed on the mask 60a selectively, so that the width of the opening 62 can be widened as illustrated in FIG. 5. In a case where the mask 60a is a resist, the mask 60a illustrated in FIG. 4 is removed and a mask 60a of a new pattern illustrated in FIG. 5 is formed, so that the width of the opening 62 can be widened. Subsequently, p-type impurities are injected into the semiconductor substrate 12 through the mask 60a with the opening 62 thus enlarged. Here, the p-type impurities are injected at a low concentration both in the shallow range and the deep range. On this account, in a range where the opening 62 is enlarged, the p-type impurities are distributed at a low concentration in the shallow range and the deep range of the semiconductor substrate 12. After that, the mask 60a is removed and annealing to activate the p-type impurities thus injected is performed, so that guard rings 40 are formed as illustrated in FIG. 6. At the time when the annealing is performed on the semiconductor substrate 12, the crystal defects existing in the guard rings 40 partially disappear, but the crystal defects remain in a predetermined ratio after the annealing. In a high concentration region 42 into which the p-type impurities are injected at a high concentration, a crystal defect density is higher than a low concentration region 44 where the p-type impurities are injected at a low concentration. Further, in the production method, an outer peripheral part 51x with a wide width is formed in a range where the opening 62 is enlarged. With the use of the production method, it is possible to form the outermost guard ring 40x having the outer peripheral part 51x with a wide width.

Figure 7:
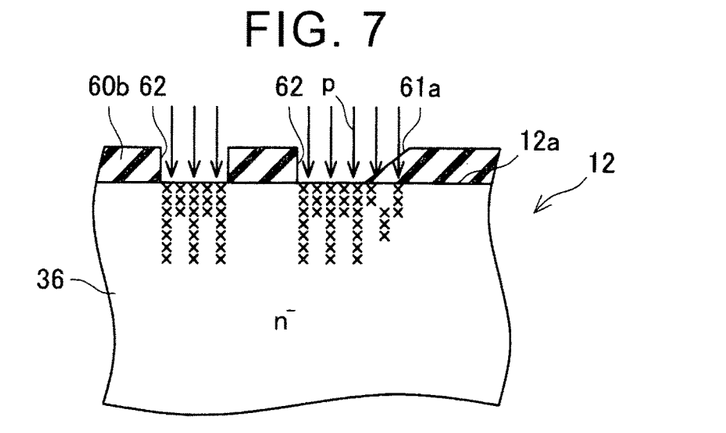
FIG. 7 is an explanatory view of a production method of a semiconductor device (a sectional view of a guard-ring formation part)
Figure 8:
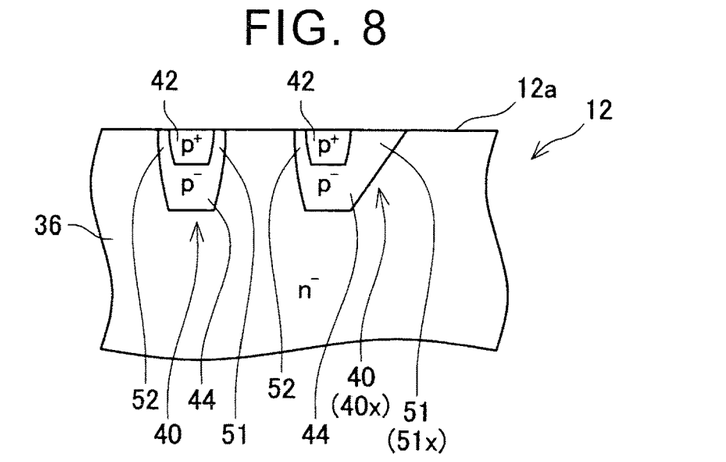
FIG. 8 is an explanatory view of the production method of the semiconductor device (a sectional view of the guard-ring formation part)

FIGS. 7, 8 illustrate a second production method. In the second production method, as illustrated in FIG. 7, a mask 60b having openings 62 is formed on a front surface 12a of a semiconductor substrate 12. Herein, the mask 60b is formed so that an outer peripheral wall surface of an opening 62 on the outermost peripheral side (that is, an opening 62 corresponding to an outermost guard ring 40x) is inclined. Subsequently, p-type impurities are injected into the semiconductor substrate 12 several times through the mask 60b while an impurity implantation energy is changed. Hereby, the p-type impurities are injected into lower semiconductor layers of the openings 62. Herein, the p-type-impurities are injected at a high concentration in a shallow range, and the p-type impurities are injected at a low concentration in a deep range. Here, in a part 61a of the inclined wall surface of the opening 62, a thickness of the mask 60b is thin.

Accordingly, at the time of the ion implantation into the deep range, the p-type impurities penetrate through the part 61a so as to be injected into the semiconductor substrate 12. Accordingly, the p-type impurities are injected into the lower semiconductor layer of the part 61a at a low concentration. Thus, in the lower semiconductor layer of the part 61a, the p-type impurities are injected at a low concentration in the shallow range. After that, the mask 60b is removed and annealing to activate the p-type impurities thus injected is performed, so that guard rings 40 are formed as illustrated in FIG. 8. With the use of the production method, it is possible to form the outermost guard ring 40x having an outer peripheral part 51x with a wide width.

Figure 9:
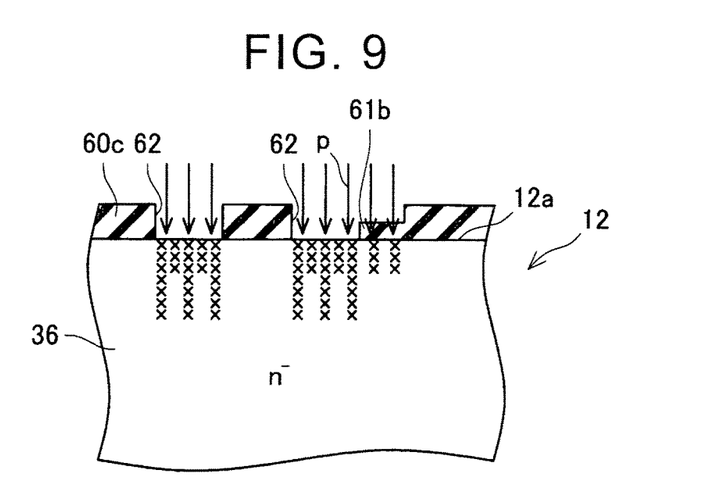
FIG. 9 is an explanatory view of the production method of the semiconductor device (a sectional view of the guard-ring formation part)

Note that, in the second production method, a mask 60c illustrated in FIG. 9 may be used instead of the mask 60b. The mask 60c illustrated in FIG. 9 has a part 61b with a thin thickness, instead of the part 61a having an inclined wall surface in FIG. 7. In a case of using the mask 60b, the p-type impurities are injected into a lower semiconductor layer of the part 61b at a low concentration at the time of ion implantation. With the use of the mask 60c, it is also possible to form an outermost guard ring 40x having an outer peripheral part 51x with a wide width.

Figure 10:
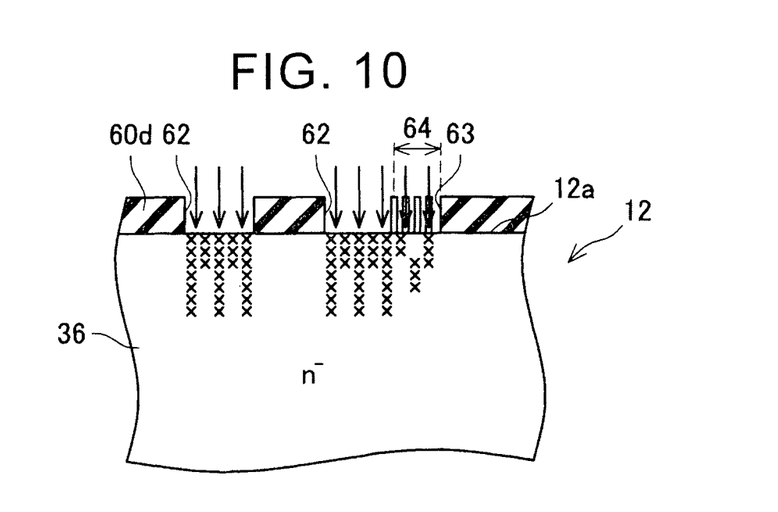
FIG. 10 is an explanatory view of a production method of a semiconductor device (a sectional view of a guard-ring formation part)
Figure 11:
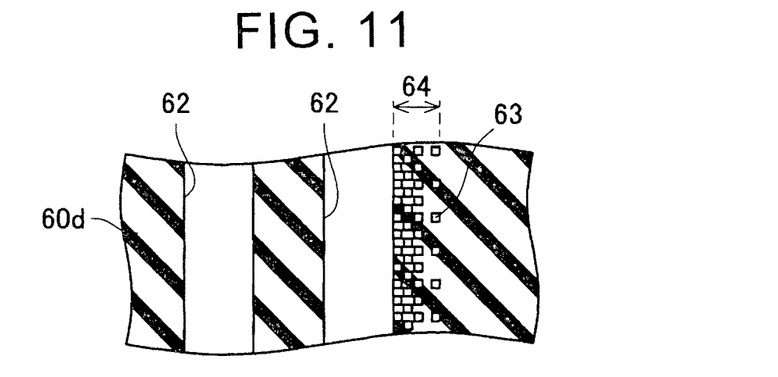
FIG. 11 is an explanatory view of the production method of the semiconductor device (a plan view of the guard-ring formation part)

FIGS. 10, 11 illustrate a third production method. In the third production method, as illustrated in FIGS. 10, 11, a mask 60d having openings 62 is formed on a front surface 12a of a semiconductor substrate 12. The mask 60d includes a region 64 having a lot of very small openings 63 further on the outer peripheral side relative to an opening 62 on the outermost peripheral side (that is, an opening 62 corresponding to an outermost guard ring 40x). A density of the very small openings 63 is high at a position near the opening 62, but is low at a position distant from the opening 62. That is, an aperture ratio in the region 64 becomes lower toward the position distant from the opening 62. Subsequently, p-type impurities are injected into the semiconductor substrate 12 several times through the mask 60d while an impurity implantation energy is changed. Herein, the p-type impurities are injected at a high concentration in a shallow range, and the p-type impurities are injected at a low concentration in a deep range. In the region 64 of the mask 60d, the p-type impurities are injected into the semiconductor substrate 12 through the very small openings 63. Since the aperture ratio of the region 64 is low, the p-type impurities are injected into a lower semiconductor layer of the region 64 at a low concentration. Particularly, the aperture ratio in the region 64 becomes lower toward the position distant from the opening 62, so the p-type impurities are injected into the lower semiconductor layer in the region 64 such that its concentration becomes lower toward the position distant from the opening 62. After that, the mask 60d is removed and annealing to activate the p-type impurities thus injected is performed, so that guard rings 40 are formed similarly to FIG. 8. With the use of the production method, it is possible to form an outermost guard ring 40x having an outer peripheral part 51x with a wide width.

Figure 12:
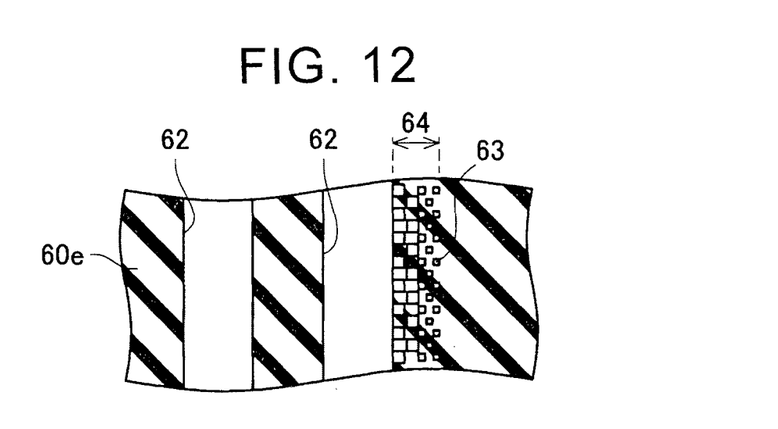
FIG. 12 is an explanatory view of the production method of the semiconductor device (a plan view of the guard-ring formation part)

Note that, in the third production method, a mask 60e illustrated in FIG. 12 may be used instead of the mask 60d. In the mask 60e, a region 64 is configured such that very small openings 63 have a larger size at a position near an opening 62, and those at a position distant from the opening 62 have a smaller size. That is, an aperture ratio in the region 64 becomes lower toward the position distant from the opening 62. Accordingly with the use of the mask 60e illustrated in FIG. 12, it is also possible to form an outermost guard ring 40x having an outer peripheral part 51x with a wide width.

Figure 13:
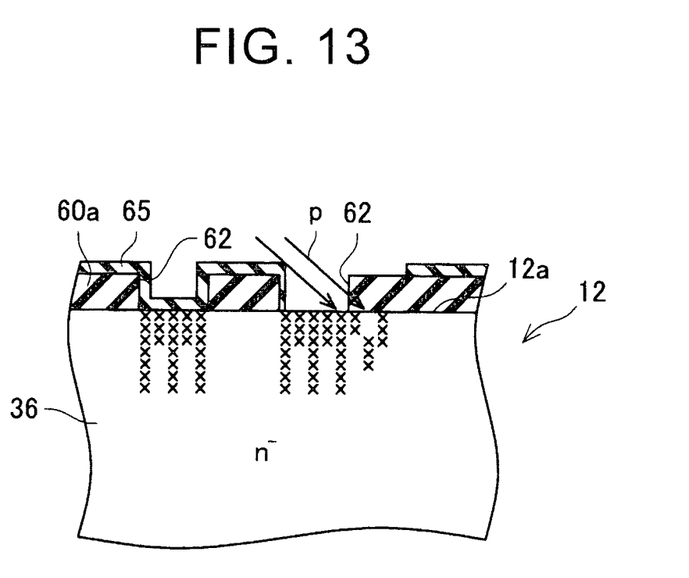
FIG. 13 is an explanatory view of a production method of a semiconductor device (a sectional view of a guard-ring formation part)

FIGS. 4, 13 illustrate a fourth production method. In the fourth production method, first, a mask 60a having openings 62 is formed, and p-type impurities are injected into a semiconductor substrate 12 through the mask 60a, as illustrated in FIG. 4. A formation step of the mask 60a and an injection step of the p-type impurities through the mask 60a are similar to the first production method. Subsequently, as illustrated in FIG. 13, a resist 65 is formed on the mask 60a so that a part around an outer peripheral wall surface in an opening 62 on an outermost peripheral side is exposed and the other parts are covered therewith. Then, an ion implantation angle is inclined to a front surface 12a of the semiconductor substrate 12 in a direction from the inner peripheral side toward the outer peripheral side, and the p-type impurities are injected into the semiconductor substrate 12. The p-type impurities partially penetrate through the mask 60a in a range where the mask 60a is not covered with the resist 65 and are injected into a semiconductor layer below the mask 60a. That is, the p-type impurities are injected, at a low concentration, into the semiconductor layer below the mask 60a in the range where the mask 60a is not covered with the resist 65. Note that, as illustrated in FIG. 2, an outermost guard ring 40x is formed in an annular manner so as to surround the element region 20, and in view of this, the p-type impurities are injected several times while an orientation to incline an injection direction is changed, so that the p-type impurities can be injected at an angle inclined from the inner peripheral side toward the outer peripheral side relative to each part of the outermost guard ring 40x. After that, the mask 60a and the resist 65 are removed and annealing to activate the p-type impurities thus injected is performed, so that guard rings 40 are formed similarly to FIG. 8. With the use of the production method, it is possible to form an outermost guard ring 40x having an outer peripheral part 51x with a wide width.

Note that, in the above embodiment, the MOSFET is formed in the element region 20, but other semiconductor elements may be provided in the element region 20. For example, an IGBT may be provided in the element region 20. By providing a p-type collector region instead of the drain region 38, it is possible to obtain the IGBT. Further, for example, a diode (a pn diode, a schottky barrier diode, and the like) in which the front-surface electrode 14 functions as an anode electrode and the back-surface electrode 16 functions as a cathode electrode may be provided in the element region. In a case where the diode is formed, when a reverse voltage is applied between an anode and a cathode, a depletion layer extends in the outer-periphery voltage withstanding region, thereby making it possible to obtain an effect similar to the above embodiment.

Further, in the above embodiment, the p-type impurity concentration in the high concentration region 42 is higher than 10% of the p-type impurity concentration at the peak point M. In order to more surely prevent depletion of the high concentration region 42, it is preferable that the high concentration region 42 have a p-type impurity concentration higher than $1\times10^{18}$ atoms/cm$^3$.

Further, in the above embodiment, the semiconductor substrate 12 is constituted by SiC, but the semiconductor substrate 12 may be constituted by other semiconductor materials (e.g., a compound semiconductor material other than SiC, or silicon and the like). However, in a case of an SiC substrate, it is easy to control a diffusion range of the p-type impurities, so that guard rings can be easily formed accurately. Accordingly, the SiC substrate is more suitable for the technique disclosed in the present specification.

The following describes a relationship between respective constituents of the embodiment and respective constituents in Claims. The MOSFET of the embodiment is an example of a semiconductor element of the present invention. The drift region 36 in the outer-periphery voltage withstanding region 22 of the above embodiment is an example of an outer-periphery drift region of the present invention. The outer peripheral part 51*x* of the embodiment is an example of a first part of the present invention. The outer peripheral parts 51 other than the outer peripheral part 51*x* and the inner peripheral parts 52 other than the inner peripheral part 52*z* in the embodiment are examples of a second part of the present invention. In the second, third, and fourth production methods, a mask (a mask through which the p-type impurities at a low concentration pass) above the outer peripheral part 51*x* of the outermost guard ring 40*x* is an example of a low permeability portion of the present invention. In the second, third, and fourth production methods, the openings 62 are an example of openings of the present invention. In the second, third, and fourth production methods, a mask (a mask of a part above a region where the guard rings 40 are not formed) of a part blocking the p-type impurities is an example of a blocking portion of the present invention.

The technical elements described in the present specification are each useful independently.

The production method of the semiconductor device, according to an example of the present specification, includes: a step of forming a plurality of p-type guard rings facing a front surface of a semiconductor substrate and surrounding a specific region in a multiple manner by injecting p-type impurities into the semiconductor substrate; and a step of completing the semiconductor device by use of the semiconductor substrate.

Note that a part of the step of completing the semiconductor device may be performed before the step of forming the guard rings.

In the production method of the semiconductor device, according to the example of the present specification, the step of forming the guard rings includes: a step of forming a mask having openings, a blocking portion, and a low permeability portion on the front surface of the semiconductor substrate; and a step of injecting the p-type impurities into the semiconductor substrate through the mask. In the step of injecting the p-type impurities, a permeability of the p-type impurities in the low permeability portion is lower than a permeability of the p-type impurities in the openings, but is higher than a permeability of the p-type impurities in the blocking portion. High concentration region are formed in respective regions within the semiconductor substrate, the respective regions being placed below the openings. A first part is formed in a region within the semiconductor substrate, the region being placed below the low permeability portion.

With the production method, it is possible to form the first part in the low concentration region of the outermost guard ring appropriately.

The embodiment of the present invention has been described in detail, but the embodiment is merely an example and does not limit the scope of Claims. The technique described in the scope of the Claims includes the foregoing concrete examples with various modifications and changes. Each of and various combinations of the technical elements explained in this specification and the drawings achieve technical utility, and the technical elements are not limited to the combination stated in Claims at the time of filing. Further, the technique exemplified in the present specification or the drawings can achieve a plurality of objects at the same time, and has a technical usability by achieving one of those objects.

What is claimed is:

1. A semiconductor device comprising:
    a semiconductor substrate;
    a front-surface electrode making contact with a front surface of the semiconductor substrate; and
    a back-surface electrode making contact with a back surface of the semiconductor substrate, wherein:
    the semiconductor substrate includes: a drain region having a high n-type impurity concentration; a drift region having a lower n-type impurity concentration than the drain region, the drain region being disposed between the back-surface electrode and the drift region; an element region overlapping with a contact face between the front-surface electrode and the semiconductor substrate in a plan view of the semiconductor substrate along a thickness direction of the semiconductor substrate; and an outer-periphery voltage withstanding region provided around the element region;
    the element region includes a semiconductor element configured to allow an electric current to flow between the front-surface electrode and the back-surface electrode;
    the outer-periphery voltage withstanding region includes a plurality of p-type guard rings facing the front surface and surrounding the element region in a multiple manner, the drift region separating the guard rings from the drain region, and an outer-periphery of the drift region separating the guard rings from each other;
    each of the guard rings includes a high concentration region having a p-type impurity concentration higher than 10% of a peak value of a p-type impurity concentration of the each of the guard rings, and a low concentration region having a p-type impurity concentration equal to or lower than 10% of the peak value and placed between the high concentration region and the outer-periphery of the drift region;
    the low concentration region of an outermost guard ring positioned on an outermost peripheral side, among the plurality of guard rings, includes a first part positioned on an outer peripheral side of the high concentration region of the outermost guard ring;
    respective low concentration regions of the guard rings include respective second parts each positioned in a range sandwiched between corresponding two adjacent high concentration regions among the plurality of high concentration regions;
    the high concentration region of the outermost guard ring is sandwiched between the first part and one of the second parts; and
    a width of the first part on the front surface is wider than each width of the second parts on the front surface.

2. The semiconductor device according to claim 1, wherein
    the semiconductor substrate is an SiC substrate.

3. A production method of a semiconductor device, comprising:
    forming a plurality of p-type guard rings facing a front surface of a semiconductor substrate and surrounding a specific region in a multiple manner by injecting p-type impurities into the semiconductor substrate; and
    completing the semiconductor device by use of the semiconductor substrate, wherein:
    the semiconductor device includes:
        the semiconductor substrate, the semiconductor substrate including a drain region having a high n-type impurity concentration, and a drift region having a lower n-type impurity concentration than the drain region, the drain region being disposed between the back-surface electrode and the drift region;

a front-surface electrode making contact with the front surface of the semiconductor substrate;

a back-surface electrode making contact with a back surface of the semiconductor substrate;

a semiconductor element provided within the specific region and configured to allow an electric current to flow between the front-surface electrode and the back-surface electrode, the drift region separating the guard rings from the drain region, and an outer-periphery of the drift region separating the plurality of guard rings from each other;

each of the guard rings includes a high concentration region having a p-type impurity concentration higher than 10% of a peak value of a p-type impurity concentration of the each of the guard rings, and a low concentration region having a p-type impurity concentration equal to or lower than 10% of the peak value and placed between the high concentration region and the outer-periphery of the drift region;

the low concentration region of an outermost guard ring positioned on an outermost peripheral side, among the plurality of guard rings, includes a first part positioned on an outer peripheral side of the high concentration region of the outermost guard ring;

respective low concentration regions of the guard rings include respective second parts each positioned in a range sandwiched between corresponding two adjacent high concentration regions among the plurality of high concentration regions;

the high concentration region of the outermost guard ring is sandwiched between the first part and one of the second parts; and a width of the first part on the front surface is wider than each width of the second parts on the front surface.

4. The production method of the semiconductor device, according to claim 3, wherein:

in the forming of the guard rings, a mask having openings, a blocking portion, and a low permeability portion is formed on the front surface of the semiconductor substrate, and the p-type impurities are injected into the semiconductor substrate through the mask;

in the injecting of the p-type impurities, a permeability of the p-type impurities in the low permeability portion is lower than a permeability of the p-type impurities in the openings, but is higher than a permeability of the p-type impurities in the blocking portion;

the high concentration regions are formed in respective regions within the semiconductor substrate, the respective regions being placed below respective openings; and the first part is formed in a region within the semiconductor substrate, the region being placed below the low permeability portion.

* * * * *